Patent [19]

Rhodes

[11] Patent Number: 4,467,439
[45] Date of Patent: Aug. 21, 1984

[54] OR PRODUCT TERM FUNCTION IN THE SEARCH ARRAY OF A PLA

[75] Inventor: Kenneth E. Rhodes, Charlotte, N.C.

[73] Assignee: IBM Corporation, Armonk, N.Y.

[21] Appl. No.: 280,418

[22] Filed: Jun. 30, 1981

[51] Int. Cl.³ ............................................ H03K 19/08
[52] U.S. Cl. .................................. 364/716; 307/465; 340/825.87
[58] Field of Search ... 364/200 MS File, 900 MS File, 364/900, 716; 340/825.83, 825.84, 825.87, 825.91; 307/465

[56] References Cited

U.S. PATENT DOCUMENTS

| | | | |
|---|---|---|---|
| 3,702,985 | 11/1972 | Proebsting | 340/825.83 |
| 3,936,812 | 2/1976 | Cox et al. | 364/716 X |
| 3,987,287 | 10/1976 | Cox et al. | 364/716 |
| 4,037,089 | 7/1977 | Horninger | 307/465 X |
| 4,084,152 | 4/1978 | Long et al. | 340/825.87 |
| 4,123,669 | 10/1978 | Devine et al. | 307/205 |
| 4,140,967 | 2/1979 | Balasubramanian et al. | 324/73 R |
| 4,233,667 | 11/1980 | Devine et al. | 364/900 |

Primary Examiner—David H. Malzahn
Attorney, Agent, or Firm—John E. Hoel

[57] ABSTRACT

A technique is disclosed for condensing the overall size of a PLA circuit and a number of circuit elements involved in carrying out a desired logical OR operation. This is done by preconditioning the product term in the AND array to be grounded and the source of the AND array elements to be connected to the positive potential, polarities which are opposite to those for the balance of the PLA circuit. Therefore, if the particular AND or search array term is selected by means of its gate going positive, the product term line output will rise in potential instead of falling. Since any search array element will have this effect in a column of elements, an OR logical function is performed in what is otherwise the AND array of the PLA. The resultant localized change in polarities achieves a significant reduction in the number of product term columns necessary to carry out an OR logical function in the conventional AND array of a PLA.

4 Claims, 5 Drawing Figures

OR PRODUCT TERM FUNCTION IN THE SEARCH ARRAY OF A PLA

FIELD OF THE INVENTION

The invention disclosed broadly relates to logic circuits and more particularly relates to program logic arrays.

BACKGROUND OF THE INVENTION

Conventional PLA Operation

Performing logic functions in an array of identical circuit elements each located at a unique intersection of an input and output line in a grid of intersecting input and output lines is well-known. It is also well-known to perform complex logic functions in a compound arrangement of these arrays called a programmable logic array chip (PLA) by using the outputs of one array as the inputs to another array. U.S. Pat. No. 3,936,812 by Cox, et al. describes such a PLA on which a number of decoders feed inputs to a first array called a product term generation or an AND array which in turn supplies outputs to a second array called a sum of product term generator or an OR array. The outputs of the OR array are then used to control the setting and resetting of a string of latches so that both combinatorial and sequential logic functions can be performed by the PLA. The particular logic functions actually performed by the given PLA are controlled by the locations and number of the active logic circuits in the AND and OR arrays of the PLA and also by how inputs are supplied to the decoders either from off the chip or from the latches. In the Cox, et al. type PLA circuitry shown for the example in FIG. 1, each binary variable A and B undergoes a two-bit partitioning to yield four input lines AOVS/B/, AB, OVS/A/ OVS/B/, and OVS/A/ B. An input line 6 will be active for a particular product term line 2 only if the gate and thin oxide for the corresponding MOSFET array device 8 was formed during manufacture. FIG. 1 shows such active array devices 8 for the input lines $A_1OVS/B/_1$, $OVS/A/_1B_1$, $A_2OVS/B/_2$, $OVS/A/_2B_2$, $A_3OVS/B/_3$, $OVS/A/_3B_3$, connected to the product term line 2. The other array devices 10 in FIG. 1 did not have their respective gate and thin oxide formed during manufacture and are therefor inactive in this circuit. To carry out an operation, for example determining the condition that a number of pairs of variables are equal, positive logic would test the condition AB and the condition OVS/A/ OVS/B/ and if either condition is satisfied, then both A and B would be equal. However, the Cox, et al. circuitry is a negative logic circuitry. By that it is meant that the product term line 2 for the AND array of FIG. 1 is precharged through charging FET 4 to a positive value when clock line MS goes positive. When a charging condition appears on any gate of an array device 8 in the AND array, the vertical product term line 2 from the AND array is discharged to the ground line 12, dropping the potential at the corresponding connected gate of the OR array connected to the product term line 2. Since the drain lines for the OR array elements are precharged to a positive value, if the OR array gate is grounded, then there will be no change to the output latch. Therefore, negative logic has to be applied so that a change will be made to occur at the output latch. Thus, if one desired to determine when A is equal to B, one applies the terms AOVS/B/ and OVS/A/ B to the gates of vertically juxtaposed FET devices 8 in the AND array connected to the same product term line 2, as shown in FIG. 1, so that if either one of those two input lines 6 is on, then the corresponding product term potential drops on line 2, the connected OR array gate is rendered nonconductive, and thus no change is made to the output latch. A lack of change in the output latch indicates that the input binary variables A and B are not equal. Correspondingly if the input variables A and B are equal, then a change will be seen to occur in the output latch. This is the conventional way to operate the Cox, et al. PLA.

Where four variables which are paired as the group $A_1$ and $B_1$ and the group $A_2$ and $B_2$ are to be examined to determine whether $A_1$ and $B_1$ are equal and then whether $A_2$ and $B_2$ are equal, one merely replicates the illustration above for $A_2$ and $B_2$. To determine whether $A_1$ and $B_1$ are equal *and* also whether $A_2$ and $B_2$ are equal, one merely applies the outputs $A_1OVS/B/_1$ and $OVS/A/_1B_1$ and $A_2OVS/B/_2$ and $OVS/A/_2B_2$ to AND array elements which are vertically juxtaposed on the same product term line 2 as shown in FIG. 1, since an AND operation is desired. FIG. 1 shows the arrangement for pairs: $A_1B_1$, $A_2B_2$, and $A_3B_3$.

The Problem with Conventional PLA Operation

However, the problem solved by the invention arises where one wishes to find the condition that $A_1$ and $B_1$ are unequal *or* that $A_2$ and $B_2$ are unequal in a Cox, et al. type PLA. In this case, $A_1B_1$ and $OVS/A/_1OVS/B/_1$ must be connected to the gates of AND array elements 8 in FIG. 2 which are vertically juxtaposed to a first product term line 2 whereas $A_2B_2$ and $OVS/A/_2OVS/B/_2$ must be connected to AND array elements 8 which are vertically juxtaposed to a second distinct product term line 22. Those product terms are then conducted down to OR array elements which are respectively vertically juxtaposed with the AND array elements 8 above, having their respective OR array drains connected to a common OR array output line. Then the OR operation is performed in the OR array since the conditional discharge by either one or the other OR array element will satisfy the OR function desired. This requires the use of two product term columns for two pairs of variables $A_1B_1$ and $A_2B_2$ to carry out the desired logical operation. FIG. 2 shows the arrangement with three pairs of variables, $A_1B_1$, $A_2B_2$ and $A_3B_3$, where $A_3B_3$ connect with active array devices 8 in product term line 32. This consumption of extra product term columns is compounded with each additional pair of input variables.

Objects of the Invention

It is therefore an object of the invention to reduce the number of product term columns necessary to carry out an OR logical function in a conventional AND array area of a PLA.

Summary of the Invention

This and other objects, features and advantages of the invention are accomplished by the OR product term function in PLAs invention disclosed herein. A technique is disclosed for condensing the overall size of a PLA circuit and a number of circuit elements involved in carrying out a desired logical OR operation. This is done by preconditioning the product term in the AND array to be grounded and the source of the AND array elements to be connected to the positive potential, polarities which are opposite to those for the balance of the PLA circuit. Therefore, if the particular AND or search array term is selected by means of its gate going positive, the product term line output will rise in potential instead of falling. Since any search array element will have this effect in a column of elements, an OR logical function is performed in what is otherwise the AND array of the PLA. The resultant localized change in polarities achieves a significant reduction in the number of product term columns necessary to carry out an OR logical function in the conventional AND array of a PLA.

DESCRIPTION OF THE FIGURES

These and other objects, features and advantages of the invention will be more fully appreciated with reference to the accompanying figures.

DISCUSSION OF THE PREFERRED EMBODIMENT

Figure 2:
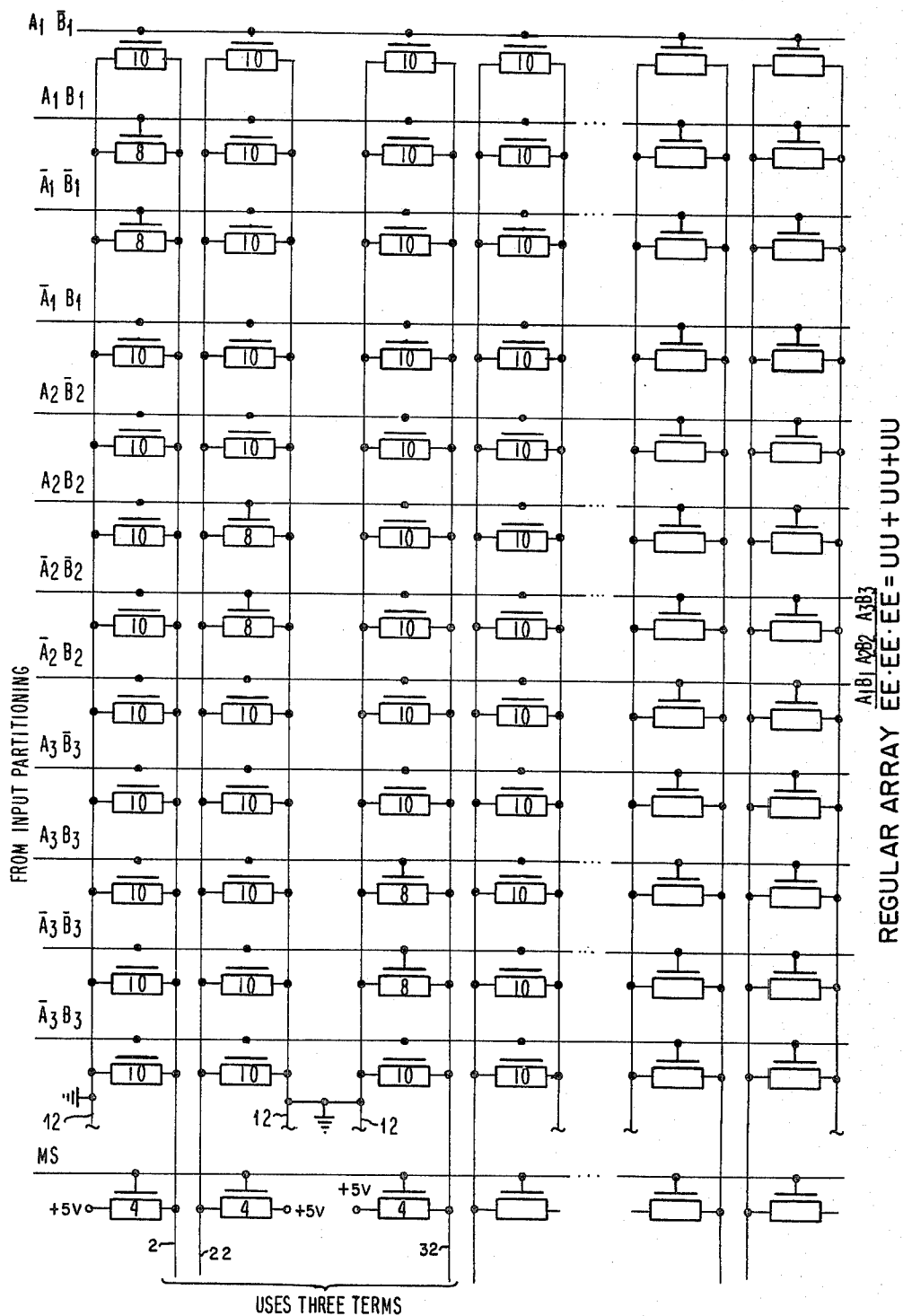
FIG. 2 is a schematic circuit diagram of a conventional array PLA which requires three product terms in the AND array to carry out a logical OR operation.
Figure 3:
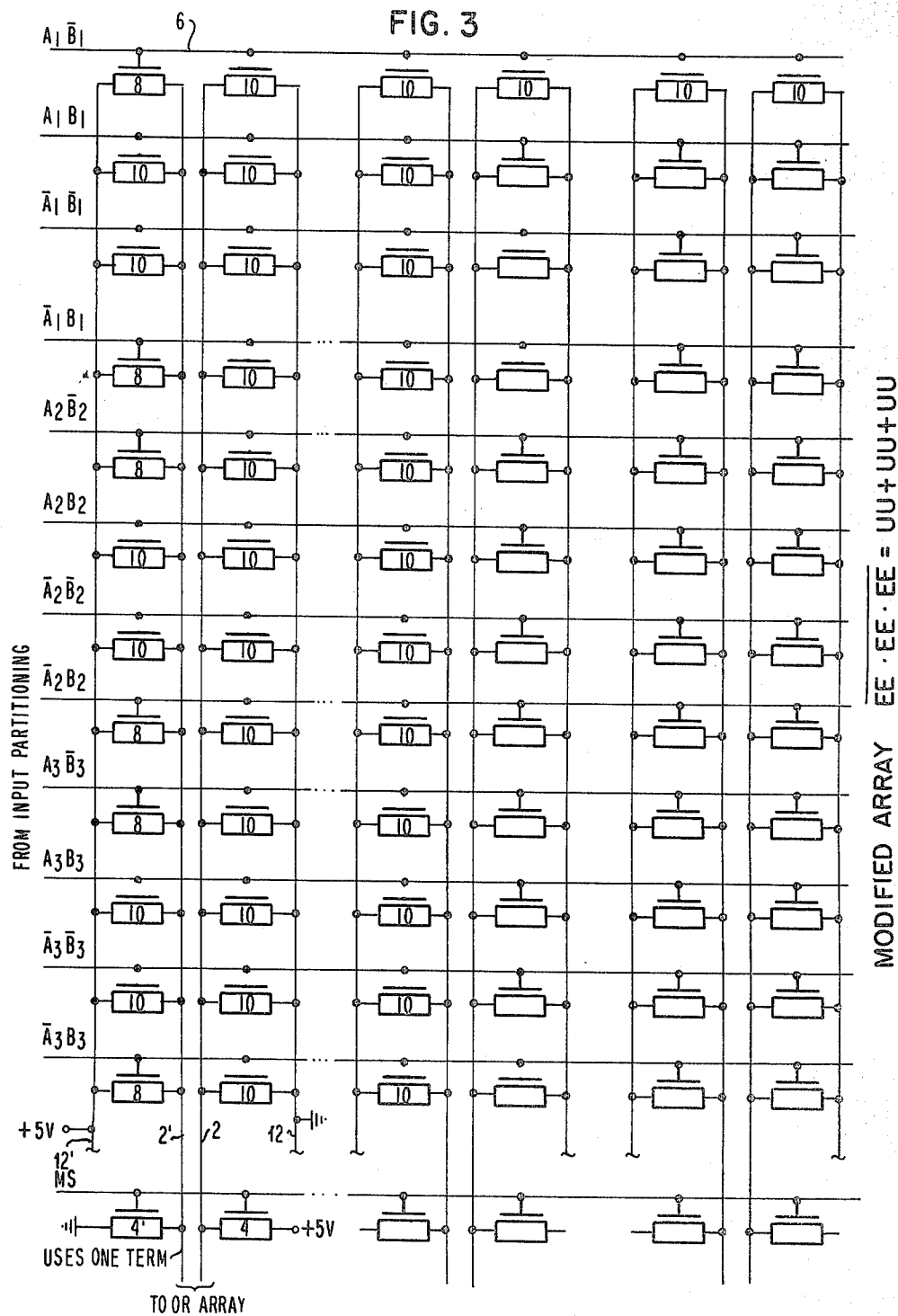
FIG. 3 is a schematic diagram of a modified PLA array which uses a single product term in the AND array to carry out a logical OR operation, in accordance with the invention.

The subject invention which is shown in FIG. 3, solves the problem of condensing the overall size of the circuit and number of circuit elements involved in carrying out the desired logical OR operation of FIG. 2, in the following manner. To carry out the OR function, the product term line $2'$ is preconditioned to be grounded through the charging FET $4'$ when clock line MS goes positive. The source of the AND array elements 8 is connected through line $12'$ to the positive potential. The polarities of lines $2'$ and $12'$ are opposite to those on lines 2 and 12, respectively, for the balance of the PLA. (To avoid confusion, the "AND" array will now be referred to as the "search array.") Therefore, if the particular search array term $2'$ is selected by means of the gate on one of the connected array devices 8 going positive, the product term output line $2'$ will rise in potential instead of falling. Since any search array element will have this effect in the same column, an OR logical function is performed for that column in what is otherwise the "AND" array of the PLA.

Where a plurality, such as six, binary variables are to be compared for pairs of inequality, the operation can be carried out in a single product term column, as opposed to the requirement of a separate product term column for each pair of binary variables to be so compared, in the conventional PLA, as described above. For example, in FIG. 3, it is desired to show that $A_1$ and $B_1$ are unequal, or that $A_2$ and $B_2$ are unequal, or that $A_3$ and $B_3$ are unequal, the same logical function which was performed by three product term columns in FIG. 2. In FIG. 3, the gates of active array devices 8 in the single column $2'$, are connected to inputs $A_1 OVS/B/_1$, $OVS/A/_1 B_1$, $A_2 OVS/B/_2$, $OVS/A/_2 B_2$, $A_3 OVS/B/_3$ and $OVS/A/_3 B_3$. Line $12'$ is connected to the positive potential and the product term output line $2'$, which is connected to the gate of array devices in the OR array, is precharged through device $4'$ to ground potential. If any pair of variables $A_1 B_1$, $A_2 B_2$ or $A_3 B_3$ is not equal, the line $2'$ goes positive, thereby producing a logical OR function in a single column of the AND array. The resultant localized switch in polarities achieves a significant reduction in the number of product term columns necessary to carry out an OR logical function in the conventional "AND" array area of a PLA.

The invention also finds application in cases where a majority of possible logical conditions are required for a function. In these cases, implementing the inverse of the excluded conditions as "OR" terms could result in significant savings. For instance, suppose that all conditions of six inputs except $\bar{1} \cdot \bar{2} \cdot \bar{3} \cdot \bar{4} \cdot \bar{5} \cdot \bar{6}$ are required for a function, then the other 63 conditions would currently have to be expressed in "AND" functions. With "OR" capability only one term $1+2+3+4+5+6$ would be required.

The "OR" product term capability can be selectively implemented in the Cox, et al. type of PLA by connecting the appropriate "AND" array devices to 5 V instead of ground, and connecting the associated product term precharge transistor to ground instead of 5 V. The attached code table for a search array shows the required polarity for lines 2(P) or $2'$ (N) connected to the array devices 8. Two bit partitioning will continue to be available by making two's complement connections of the standard implementation from the input partitioning circuits.

Figure 4:
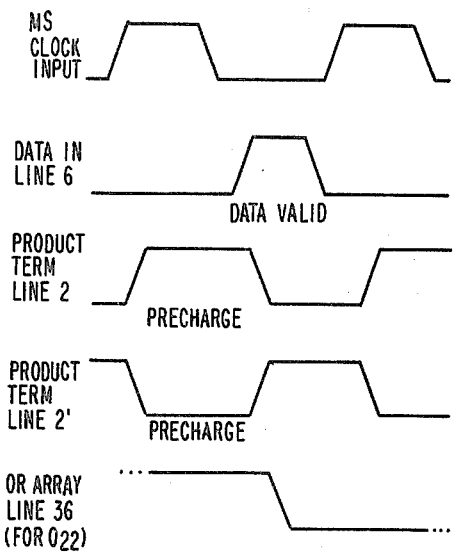
FIG. 4 is a timing diagram for the PLA circuitry of FIG. 3.

FIG. 4 shows a timing diagram of the MS clock in the top waveform, the data input on line 6 in the second waveform, and the data output on line 2 or $2'$ in the third and fourth waveforms, respectively. The OVS/MS/ clock waveform is the inverted MS clock waveform. External variables are connected directly to the input partitioning section where they may be passed through or two bit partitioned. In either case, the signal is gated to the search array gate lines 6 during OVS/MS/ time. OVS/MS/ is generated from MS. The search array outputs 2 or $2'$ (word lines) are always connected to their respective personalized OR array gates which are, therefore, always at the same potential.

Figure 1:
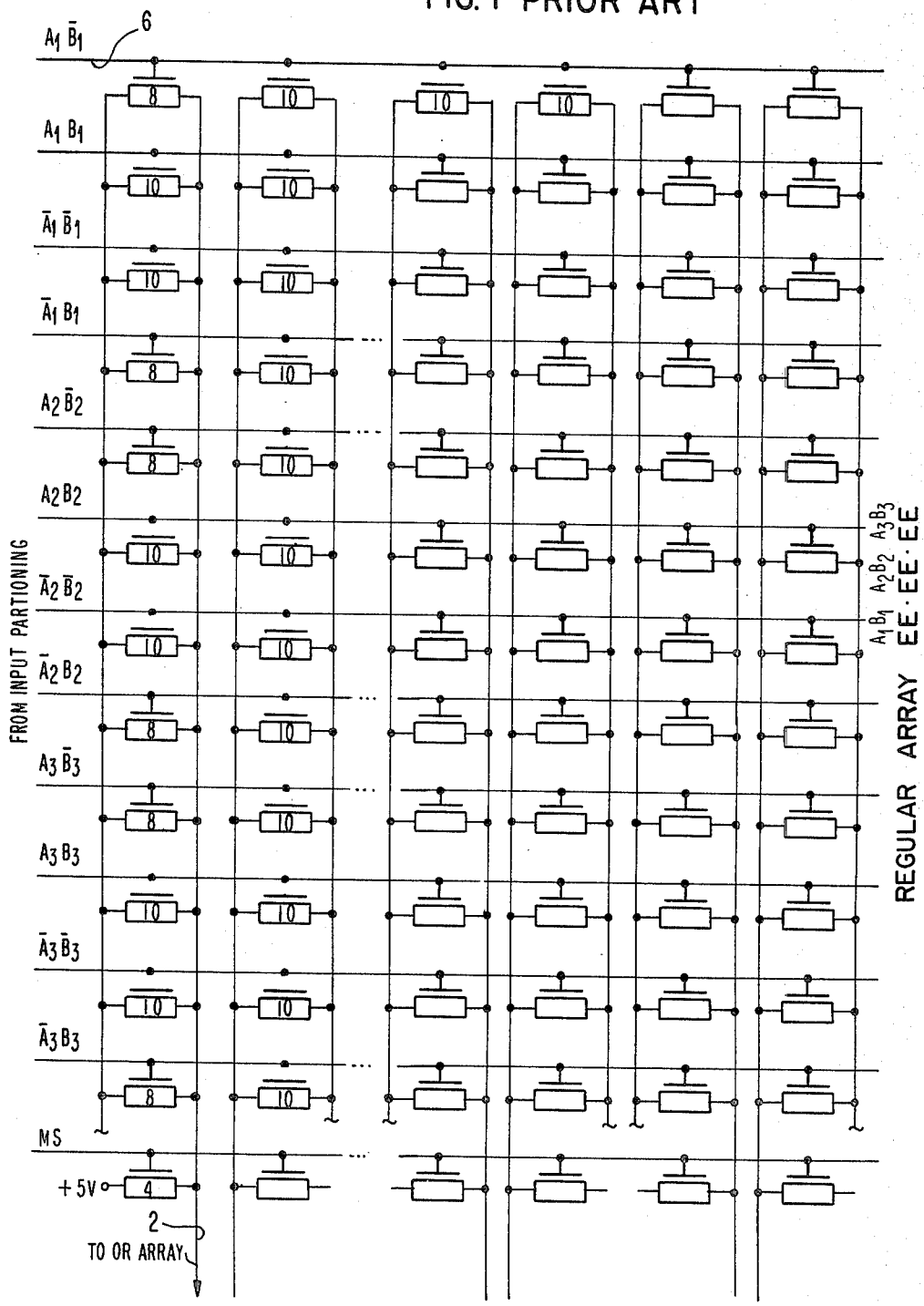
FIG. 1 is a schematic circuit diagram of a conventional PLA array.

In the conventional operation of FIGS. 1 and 2, the search array outputs 2 and personalized OR array gates are raised to the up potential during MS time. However, OR array devices cannot conduct because OVS/MS/ is holding the clocked OR array loads in nonconducting mode. When MS falls and OVS/MS/ starts to rise, the logical (0,1) condition of inputs 6 are gated to search array gates and (when up) some search array outputs 2 are pulled to the down level. Meanwhile, OVS/MS/ also causes the clock OR array loads to conduct and all OR array output lines to latch inputs begin to rise. If some of the lines 2 go to down level this rise can continue, but, if a line 2 remains at up level, any personalizations in the OR array will clamp the associated output at down level. There is a time, then, of uncertainty while the product lines 2 and OR array outputs reach their correct logical levels.

Then a delayed OVS/MS/ rises and gates each OR array output to a gate of its associated latch. However, the actual change in latch state (if any) does not occur until MS rises again.

In the search array word lines of this invention in FIG. 3, the product term outputs $2'$ will be preconditioned to the down level during MS time, and will rise to the up level only when an up level is applied to an associated gate on line 6 during OVS/MS/ time. The uncertainty time in the OR array timing and latch gating is effectively unchanged. The fifth or bottom waveform of FIG. 4 shows the output for the OR array.

Although the specific implementation is shown as an improvement to Cox, et al. type PLA's, the invention is applicable to all PLA's where the output of the search array is inverted. The importance of the specific implementation in a Cox, et al. type PLA is that there is no delay introduced to implement the polarity inversion.

Description of Operation

Figure 5:
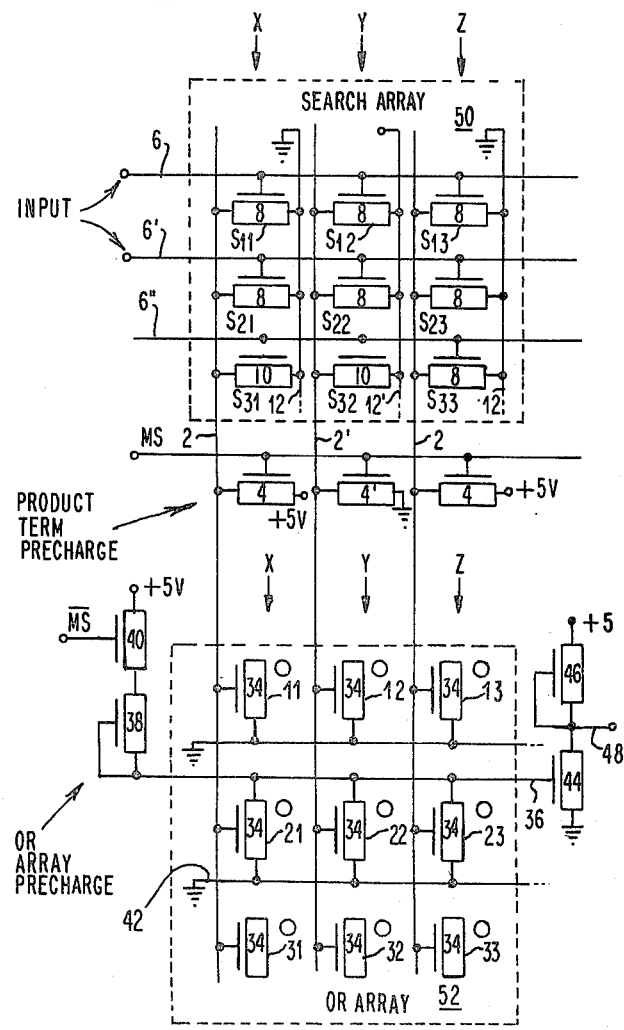
FIG. 5 is a schematic diagram of the modified PLA array of FIG. 3, showing both the search array and the OR array.

FIG. 5 shows an overall electrical schematic diagram of the PLA invention, including an example of the search array in accordance with the invention and an example of the OR array. The programmed logic array of FIG. 5 includes the search array 50 and the OR array 52. The search array 50 includes a plurality of FET array devices arranged into horizontal rows and vertical columns, with the array devices designated $S_{ij}$ in standard matrix notations so that the array device $S_{12}$

CODE TABLE FOR SEARCH ARRAY "OR" PRODUCT TERM

| Single-Bit/Partitioned Array | | | -A- | | -B- | | Two-Bit/Partitioned Array | | |
|---|---|---|---|---|---|---|---|---|---|
| Table Representation | | | A | $\overline{A}$ | B | $\overline{B}$ | | Table Representation | |
| -A- | -B- | Function | AB | A$\overline{B}$ | $\overline{A}$B | $\overline{A}\,\overline{B}$ | Function | -A- | -B- |
| . | . | NIL | 0 | 0 | 0 | 0 | NIL (No Eff.) | . | . |
| . | I | B | 1 | 1 | 1 | 0 | A or B | P | P |
| . | O | Not B | 1 | 1 | 0 | 1 | A or not B | P | N |
| . | . | FALSE | 1 | 1 | 0 | 0 | A | I | . |
| I | . | A | 1 | 0 | 1 | 1 | Not A or B | N | P |
| I | I | A and B | 1 | 0 | 1 | 0 | B | . | I |
| I | O | A and not B | 1 | 0 | 0 | 1 | A equal B | E | E |
| . | . | FALSE | 1 | 0 | 0 | 0 | A and B | I | I |
| O | . | Not A | 0 | 1 | 1 | 1 | Not A or not B | N | N |
| O | I | Not A and B | 0 | 1 | 1 | 0 | A unequal to B | U | U |
| O | O | Not A and not B | 0 | 1 | 0 | 1 | Not B | . | O |
| . | . | FALSE | 0 | 1 | 0 | 0 | A and not B | I | O |
| . | . | FALSE | 0 | 0 | 1 | 1 | Not A | O | . |
| . | . | FALSE | 0 | 0 | 1 | 0 | Not A and B | O | I |
| . | . | FALSE | 0 | 0 | 0 | 1 | Not A and not B | O | O |
| . | . | FALSE | 1 | 1 | 1 | 1 | TRUE | | |

NOTES:
1...FALSE means no useful function.
2...P = positive, N = negative for all 'OR' functions in the same way I and O were used for 'AND' functions. E = equal (compare), U = unequal (exclusive OR).

The subject invention provides the modification required to change PLA search array terms from logical "AND" statements to logical "OR" statements. Since this can be applied selectively, PLAs can now have any combination of logical "AND" and "OR" terms in the search arrray.

It should also be clear that by analogous changes of voltage and ground connections, output logical "OR" terms can also be selectively converted to logical "AND" terms.

With this invention, the logical power of PLAs is markedly enhanced. Previously logical power was limited to logical "OR" combination of logical "AND" statements, e.g.: $(I_1.I_2 \ldots I_k \ldots I_{n-1}.I_n) + (I_1.I_2 \ldots I_j \ldots I_{n-1}.I_n)$ where "." means logical "AND" and "+" means logical "OR." In addition any pairs of terms could be combined to implement OR, equal, and unequal functions for that pair, e.g.: $(I_1.I_2.(I_3+I_4) \ldots I_k \ldots I_{n-1}.I_n) + (I_1.I_2.(I_3=I_4) \ldots I_k \ldots I_{n-1}.I_n)$. When a search term is converted to a logical "OR" statement, pairing provides the AND, equal and unequal functions. These terms can then be combined logically "AND" or "OR" in the OR array, e.g.:

$$(I_1.I_2.(I_3+I_4) \ldots I_k \ldots I_{n-1}.I_n).(I_1+I_2+(I_3.I_4)+ \ldots I_k+ \ldots I_{n-1}+I_n)$$

Thus, the principle of this invention provides a higher logic power per unit and for PLA circuits, than has previously been available.

would be located in the first row and the second column of the array, for example. The gates of the FET array devices in each row of the search array 50 are selectively connected to a respective row input signal line 6, 6', 6", etc. When the gate is electrically connected to its corresponding input signal line at the time of manufacture, it is designated by the reference number 8 in FIG. 5, whereas if the gate of the array FET device is intentionally not connected to its corresponding input signal line, then it is designated with the reference numeral 10 in FIG. 5. Each input signal line 6, 6', 6", etc. provides an input logical signal during the second period OVS/MS/ following a first precharged period MS, as previously described. The source/drain paths of the FET array devices in each respective column X, Y, or Z in the search array 50, are connected to a respective product term output line 2 or 2', as is shown in FIG. 5.

Also shown in FIG. 5 is the OR array 52 which includes a plurality of FET array devices arranged into rows and columns, with each device being designated $O_{ij}$, in standard matrix notation. The gates of the FET array devices in each column X, Y or Z, are selectively connected to a respective one of the product term output lines 2 or 2', as is shown in FIG. 5. Each FET array device in the OR array 52 is labeled 34 and can have its gate selectively connected or disconnected from the corresponding product term line 2 or 2' at the time of manufacture. The source of each FET array device 34 in each row of the OR array 52, is connected by means of a line 42 to ground potential.

The drain of each FET array device 34 in each row of the OR array 52 is connected in common to line 36. Line 36 is connected through the FET load device 38 and the FET clocked load device 40 to a +5 volt reference potential. The clocked load device 40 is turned on during the OVS/MS/ time. The line 36 is connected to the gate of an output inverter comprising the active FET device 44 and the load device 46, whose drain is connected to +5 volt potential. The output node at the source of the load device 46 is the output node 48 for the row of FET array devices $O_{21}$, $O_{22}$, and $O_{23}$, as is shown in FIG. 5.

In the search array 50, a first one of the columns labeled X in the search array 50 has the source/drain path of the FET array devices $S_{11}$, $S_{21}$, and $S_{31}$ connected between ground reference potential on the line 12 and the respective product term line 2. The product term line 2 is precharged during MS time through the precharged FET device 4, whose drain is connected to +5 volts. Thus during the first precharged period MS, the product term line 2 is precharged to +5 volts. This enables the product term 2 in column X to perform negative logical functions during the second period OVS/MS/. This can be explained with the following example.

Assume that the AND logical function of the input variables U and V is desired to be carried out. Column X will be selected to generate the product term which will be output from the search array 50 to the OR array 52 to carry out this logical function. The term negative logic is defined to mean that if U·V is the desired logical function, then the input lines 6 and 6' must have the complementary binary variables OVS/U/ and OVS/V/ respectively input thereon. The negative logic mode of operation will then ultimately generate the AND logical function of U and V at the output 48 of the PLA circuit. The FET array devices $S_{11}$ and $S_{21}$ are made active by connecting their gates to the respective input signal lines 6 and 6' at the time of manufacture. The balance of the FET array devices in column X of the search array 50, for example the device $S_{31}$, are rendered inactive at the time of manufacture. During the MS interval, the product term line 2 is precharged through the precharged device 4 to a +5 volt potential. During the following OVS/MS/ interval, the value of the input signal OVS/U/ on line 6 and OVS/V/ on line 6' will selectively turn on array devices $S_{11}$ and $S_{21}$, respectively, conditionally discharging the +5 potential on the product term line 2. During the OVS/MS/ interval, the clocked load device 40 in the OR array precharge will provide a positive current through the load device 38 to the line 36. If any of the OR array FET devices $O_{21}$, $O_{22}$ or $O_{23}$ are conductive, then the line 36 will not rise in potential but remain at substantially group potential. If all of the FET array elements in that row of the OR array 52 are nonconductive, then the line 36 will rise to a +5 volt potential, thereby turning on the active device 44 of the output inverter circuit, and substantially grounding the output terminal 48. A truth table for the operation of column X in the search array 50, where a binary 0 equals ground potential and the binary 1 equals +5 volt potential, is shown in the following table:

TABLE

| Column X - AND Function | | | | | | | | | |
|---|---|---|---|---|---|---|---|---|---|
| U | V | U̅ | V̅ | $S_{11}$ | $S_{21}$ | Product Term 2 | $O_{21}$ | Line 36 | Output 48 |
| 0 | 0 | 1 | 1 | on | on | gnd. | off | up | 0 |
| 0 | 1 | 1 | 0 | on | off | gnd. | off | up | 0 |
| 1 | 0 | 0 | 1 | off | on | gnd. | off | up | 0 |
| 1 | 1 | 0 | 0 | off | off | +5V | on | down | 1 |

It can be seen in the above table that an AND logical function of the variables U and V is carried out by column X of the PLA in FIG. 5.

A second one of the columns Y in the search array 50 has the source/drain path of the FET array devices $S_{12}$, $S_{22}$ and $S_{32}$ connected between the +5 volt reference potential on line 12' and the product term line 2'. In accordance with the invention, the product term line 2' is precharged during the MS time interval through the precharged FET device 4' whose source is connected to ground potential. Thus, during the MS interval, the product term line 2' is precharged to ground potential. Then, during the subsequent OVS/MS/ interval, in input signal on either input line 6 or input line 6' can turn on the corresponding FET array devices $S_{12}$ or $S_{22}$, thereby connecting the 5 volt potential on line 12' to the product term line 2', causing the potential of the product term line 2' to rise to substantially 5 volts. The rise in potential on the product term line 2' is then applied to the gates of the FET array devices $O_{12}$, $O_{22}$ and $O_{32}$ in the OR array 52. During the OVS/MS/ interval, the clocked load device 40 is conducting and positive current flows through the load device 38 into the line 36. If the FET array device $O_{22}$ is conducting by virtue of a positive potential on the product term line 2', the current flowing from the load device 38 into the line 36 will flow through the FET array device $O_{22}$ to ground on line 42. Thus, the potential of line 36, which is applied to the gate of the active device 44 and the output inverter, remains low and the potential on the output terminal 48 is high. An example of the operation of the column Y in the search array 50 in conjunction with the balance of the PLA circuit shown in FIG. 5, will be described for a logical OR function in the following example.

The connection of the line 12' to a +5 volt potential and the connection of the source for the precharged FET device 4' to ground potential in the Y column of the search array 50 in FIG. 5, provides a positive logic mode of operation. If a logical OR function is desired to be performed between the binary variable U and the binary variable V, the binary signal for U is applied to the input line 6 and the binary signal for the variable V is applied to the input line 6'. The FET array device $S_{12}$ and $S_{22}$ are formed with their gates respectively connected to the input lines 6 and 6'. The gate of the FET array device $S_{32}$ is intentionally not connected to its corresponding input line 6" at the time of manufacture. During the MS interval, the FET precharged device 4' is conductive and precharges the product term line 2' to ground potential. Thereafter, during the OVS/MS/ time interval, the logic signal U is applied to line 6 and the logic signal V is applied to line 6'. Also during the OVS/MS/ time interval, if the FET array device $O_{22}$ and OR array 52 is conductive due to a positive potential on the product term line 2', then the positive current which is gated through the clocked load device 40 and the static load device 38 to the line 36, will be conducted through the device $O_{22}$ to the line 42 and ground potential, thereby maintaining the line 36 at a low potential and therefore the output node 48 will be at a high potential. The operation of the circuit for the various binary values of U and V and for the resulting binary signal output at 48 are shown in the following truth table.

TABLE

| | | | | Column Y - OR Function | | |
|---|---|---|---|---|---|---|
| U | V | $S_{12}$ | $S_{22}$ | Product Term 2' | $O_{22}$ | Line 36 | Output 48 |
| 0 | 0 | off | off | gnd. | off | up | 0 |
| 0 | 1 | off | on | +5V. | on | down | 1 |
| 1 | 0 | on | off | +5V. | on | down | 1 |
| 1 | 1 | on | on | +5V. | on | down | 1 |

It can be seen with reference to the above table that the logical operation being performed by the column Y of the search array 50 and the OR array 52 is that of a logical OR function between the binary variables U and V. Since the actual binary variables U and V are input to the search array 50, this operation is defined as a positive logic operation.

Thus it is seen how the invention provides both positive logical functions and negative logical functions within the same search array 50 in FIG. 5.

Although a specific embodiment of the invention has been disclosed, it will be understood by those of skill in the art that the foregoing and other changes in form and details will be made therein without departing from the spirit and the scope of the invention.

Having thus described our invention, what we claim as new, and desire to secure by Letters Patent is:

1. In a programmed logic array including a search array and an OR array, with the search array including a plurality of FET array devices arranged into rows and columns with the gates thereof in each row selectively connected to a respective row input signal line and with the source/drain paths thereof in each column connected to a respective product term output line, and with the OR array including a plurality of FET array devices arranged into rows and columns, with the gates thereof in each column selectively connected to a respective one of said product term output lines and with a first source/drain path terminal thereof in each row connected to a first polarity reference potential and a second source/drain path terminal thereof in each row connected to a second polarity reference potential and also connected to an output node, the improvement comprising:
   a first one of said columns in said search array having the source/drain path of said FET array devices therein connected between a reference potential of said first polarity and a respective one of said product term lines which is precharged to said second polarity, for performing first-type logical functions;
   a second one of said columns in said search array having the source/drain path of said FET array devices therein connected between a reference potential of said second polarity and a respective one of said product term lines which is precharged to said first polarity, for performing second-type logical functions.

2. In a programmed logic array including a search array and an OR array, with the search array including a plurality of FET array devices arranged into rows and columns, with the gates thereof in each row selectively connected to a respective row input signal line for providing input logical signals during a second period following a first precharged period and with the source/drain paths thereof in each column connected to a respective product term output line, and with the OR array including a plurality of FET array devices arranged into rows and columns, with the gates thereof in each column selectively connected to a respective one of said product term output lines and with the source thereof in each row connected to a first polarity reference potential and drain thereof in each row connected to a second polarity reference potential and also connected through a signal inverter to an output node, the improvement comprising:
   a first one of said columns in said search array having the source/drain path of said FET array devices therein connected between a reference potential of said first polarity and a respective one of said product term lines which is precharged to said second polarity during said first period, for performing negative logical functions during said second period;
   a second one of said columns in said search array having the source/drain path of said FET array devices therein connected between a reference potential of said second polarity and a respective one of said product term lines which is precharged to said first polarity during said first period, for performing positive logical functions during said second period.

3. In a programmed logic array including a search array having signal output lines connected to the inputs of an OR array, with the search array including a plurality of FET array devices arranged into rows and columns, with the gates of FET array devices in each row selectively connected to a respective row input signal line, the improvement comprising:
   a first one of said columns in said search array having the source/drain path of said FET array devices therein connected between a first polarity precharged one of said signal output lines and a second polarity reference voltage, for providing an AND logical function;
   a second one of said columns in said search array having the source/drain path of said FET array devices therein connected between a second one of said signal output lines precharged to said second polarity and a reference voltage of said first polarity, for providing an OR logical function.

4. In a programmed logic array of the type which operates on binary variables in an AND array matrix of logic performing elements to generate product terms, said array elements including a first plurality of FET devices having their drains connected in common with a first product term output line and a first precharge switching device to a relatively high potential and their sources connected in common to a relatively low potential, the improvement for selectively providing an OR term in said AND array, comprising:
   a second plurality of FET devices in said AND array having their sources connected in common to said relatively high potential and their drains connected in common with a second product term output line and a second precharge switching device to said low potential;
   whereby OR terms are provided in said AND array.

* * * * *